US010655222B2

(12) United States Patent
Kurita et al.

(10) Patent No.: US 10,655,222 B2
(45) Date of Patent: May 19, 2020

(54) THIN FILM ENCAPSULATION PROCESSING SYSTEM AND PROCESS KIT

(71) Applicant: Applied Materials, Inc., Santa Clara, CA (US)

(72) Inventors: Shinichi Kurita, San Jose, CA (US); Srikanth V. Racherla, Fremont, CA (US); Suhas Bhoski, Bangalore (IN); Xiangxin Rui, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 290 days.

(21) Appl. No.: 15/829,667

(22) Filed: Dec. 1, 2017

(65) Prior Publication Data
US 2018/0155835 A1   Jun. 7, 2018

(30) Foreign Application Priority Data

Dec. 2, 2016   (IN) .............................. 201641041254

(51) Int. Cl.
| | |
|---|---|
| *C23C 16/455* | (2006.01) |
| *C23C 16/04* | (2006.01) |
| *C23C 16/458* | (2006.01) |
| *C23C 16/44* | (2006.01) |
| *C23C 16/54* | (2006.01) |

(52) U.S. Cl.
CPC ...... *C23C 16/45544* (2013.01); *C23C 16/042* (2013.01); *C23C 16/4401* (2013.01); *C23C 16/4412* (2013.01); *C23C 16/458* (2013.01); *C23C 16/45529* (2013.01); *C23C 16/45542* (2013.01); *C23C 16/45582* (2013.01); *C23C 16/45585* (2013.01); *C23C 16/54* (2013.01); *C23C 16/45565* (2013.01)

(58) Field of Classification Search
None
See application file for complete search history.

(56) References Cited

U.S. PATENT DOCUMENTS

| | | | |
|---|---|---|---|
| 4,609,566 A | * | 9/1986 | Hongo ...................... G03F 1/72 |
| | | | 118/50.1 |
| 2012/0000786 A1 | | 1/2012 | Mayer et al. |
| 2012/0258259 A1 | * | 10/2012 | Bansal ................ C23C 16/4401 |
| | | | 427/558 |
| 2015/0090341 A1 | | 4/2015 | Ng et al. |
| 2016/0319422 A1 | | 11/2016 | Kurita et al. |

FOREIGN PATENT DOCUMENTS

| | | |
|---|---|---|
| KR | 20040048441 A | 6/2004 |
| KR | 2016-0136019 A | 11/2016 |

OTHER PUBLICATIONS

PCT/US2017/064174, International Search Report dated Apr. 20, 2018, 14 pages.

* cited by examiner

*Primary Examiner* — Karla A Moore
(74) *Attorney, Agent, or Firm* — Patterson + Sheridan, LLP

(57) ABSTRACT

The present disclosure relates to methods and apparatus for a thin film encapsulation (TFE). In one embodiment a process kit for use in an atomic layer deposition (ALD) chamber is disclosed and includes a dielectric window, a sealing frame, and a mask frame connected with the sealing frame, wherein the mask frame has a gas inlet channel and a gas outlet channel formed therein on opposing sides thereof.

16 Claims, 10 Drawing Sheets

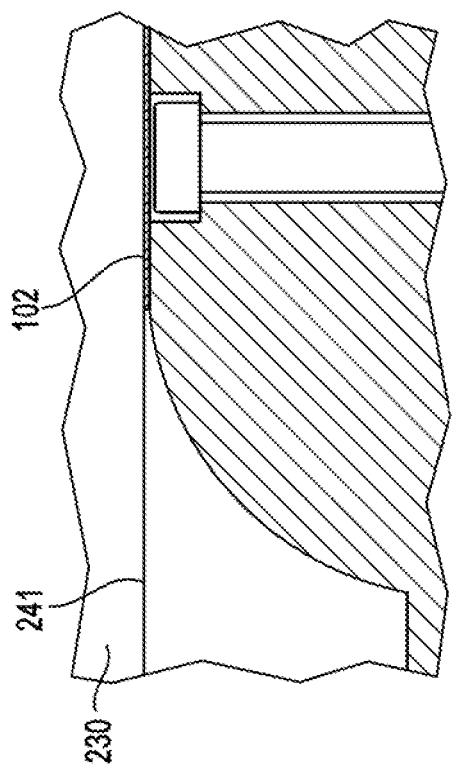
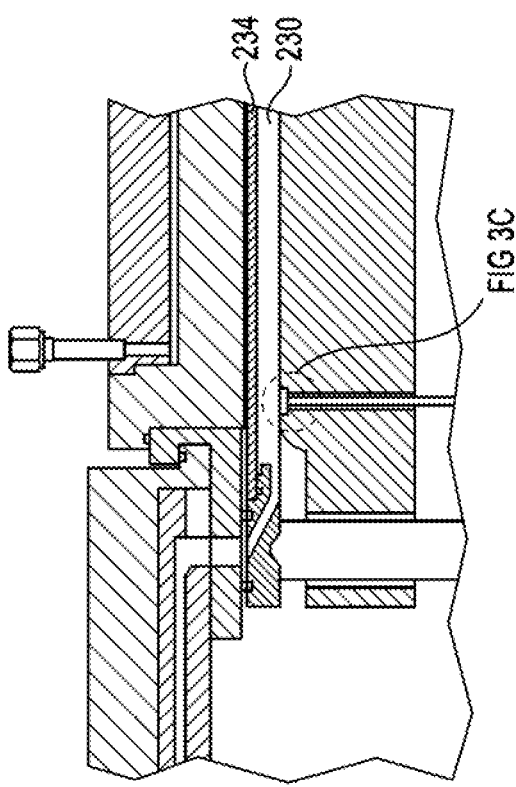
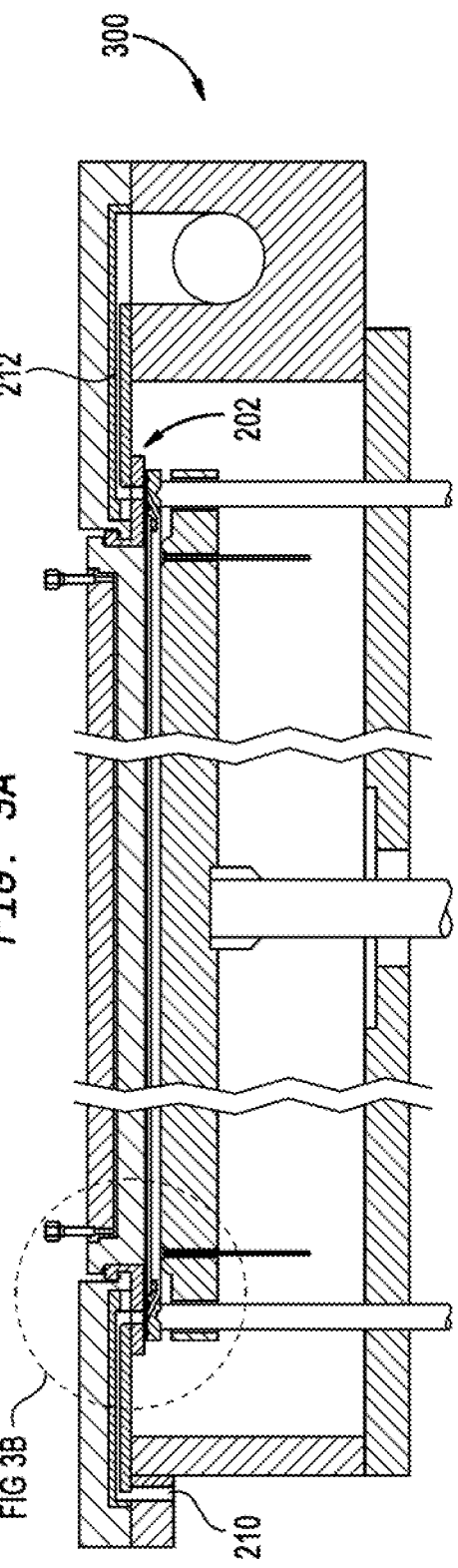

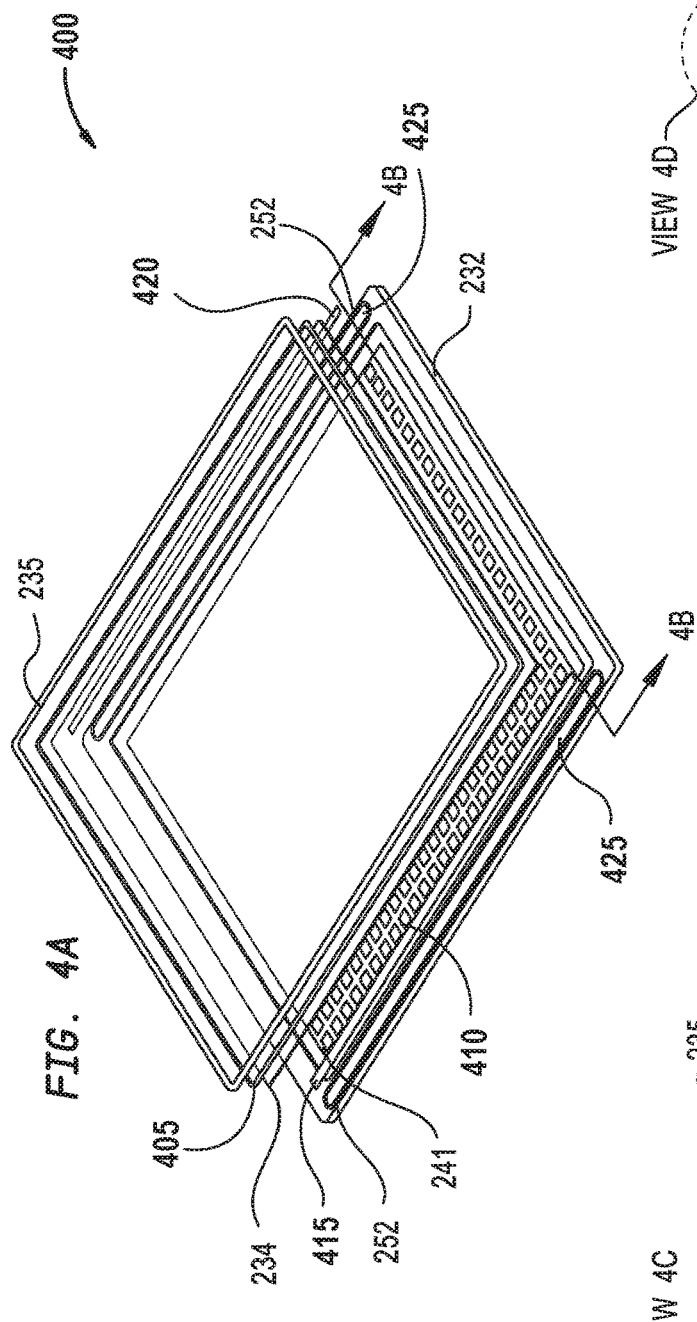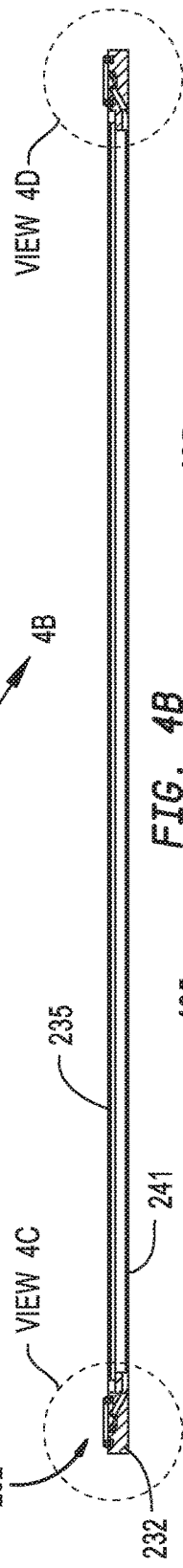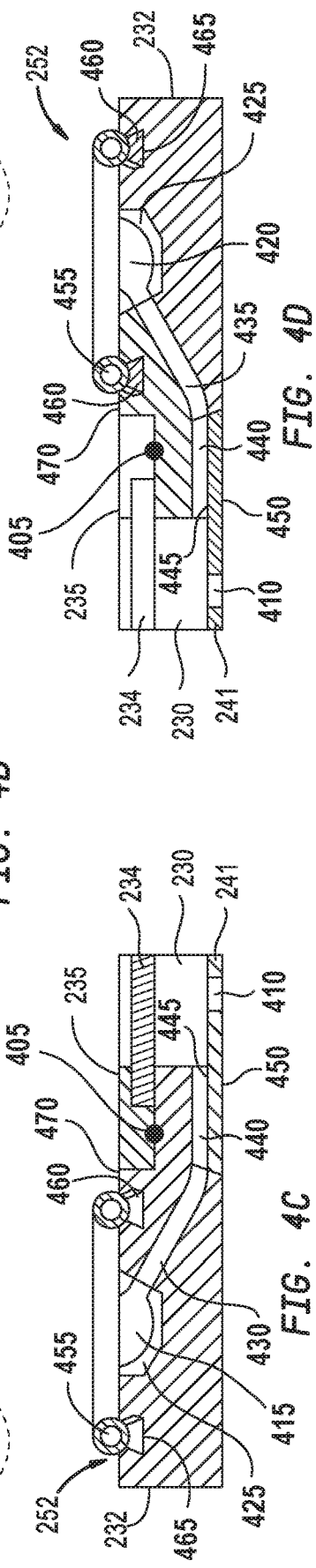

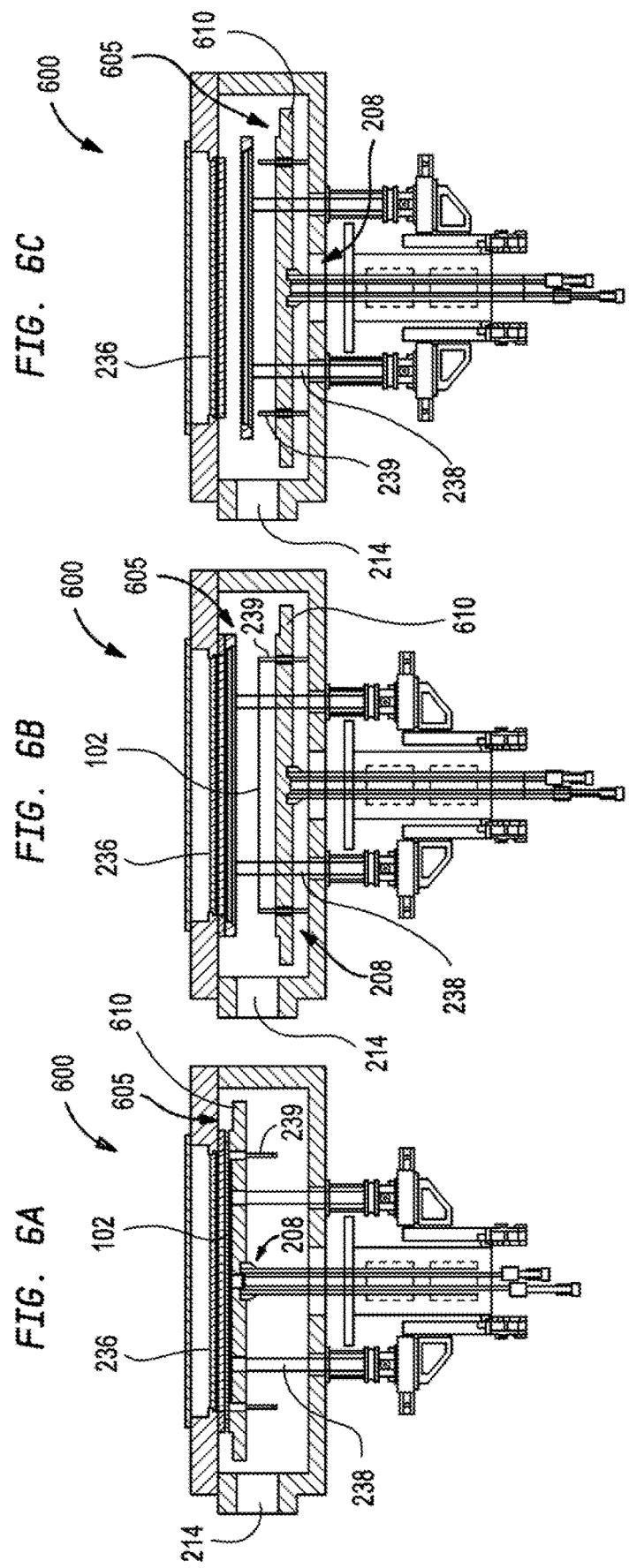

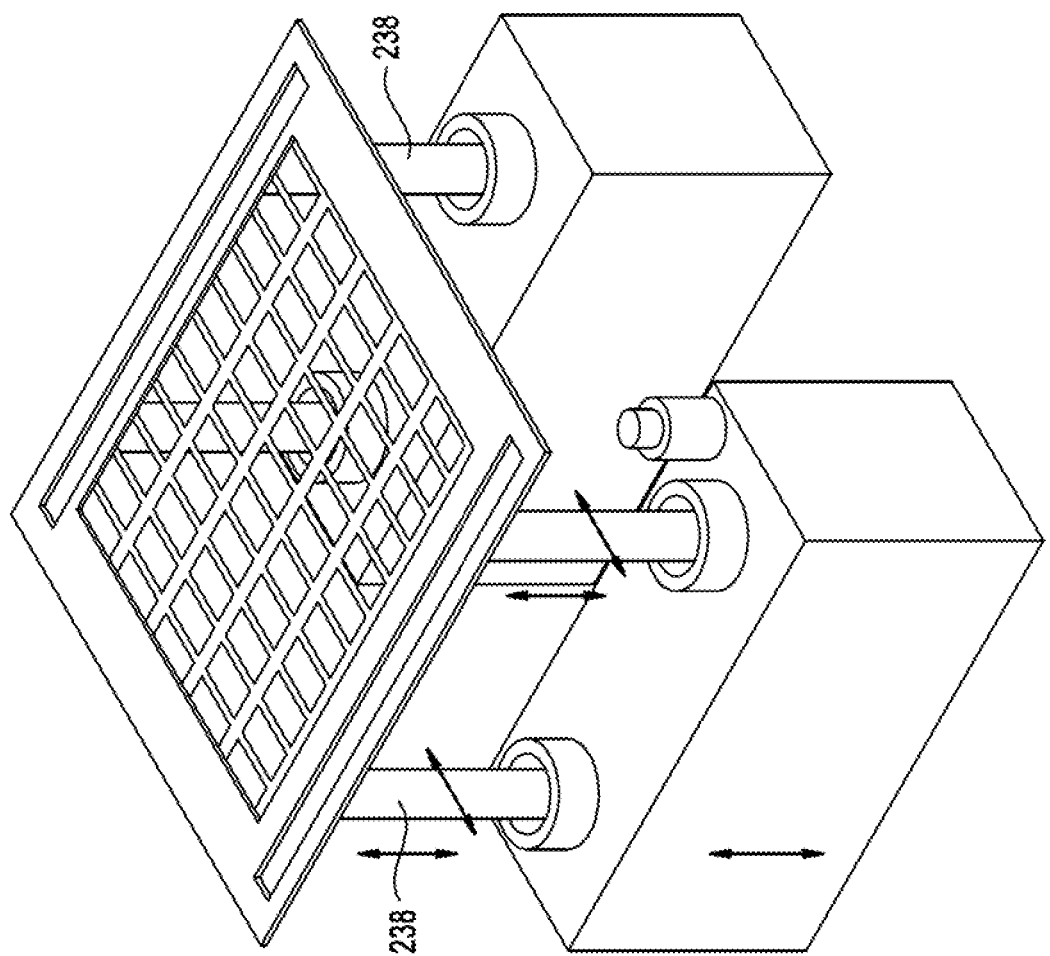

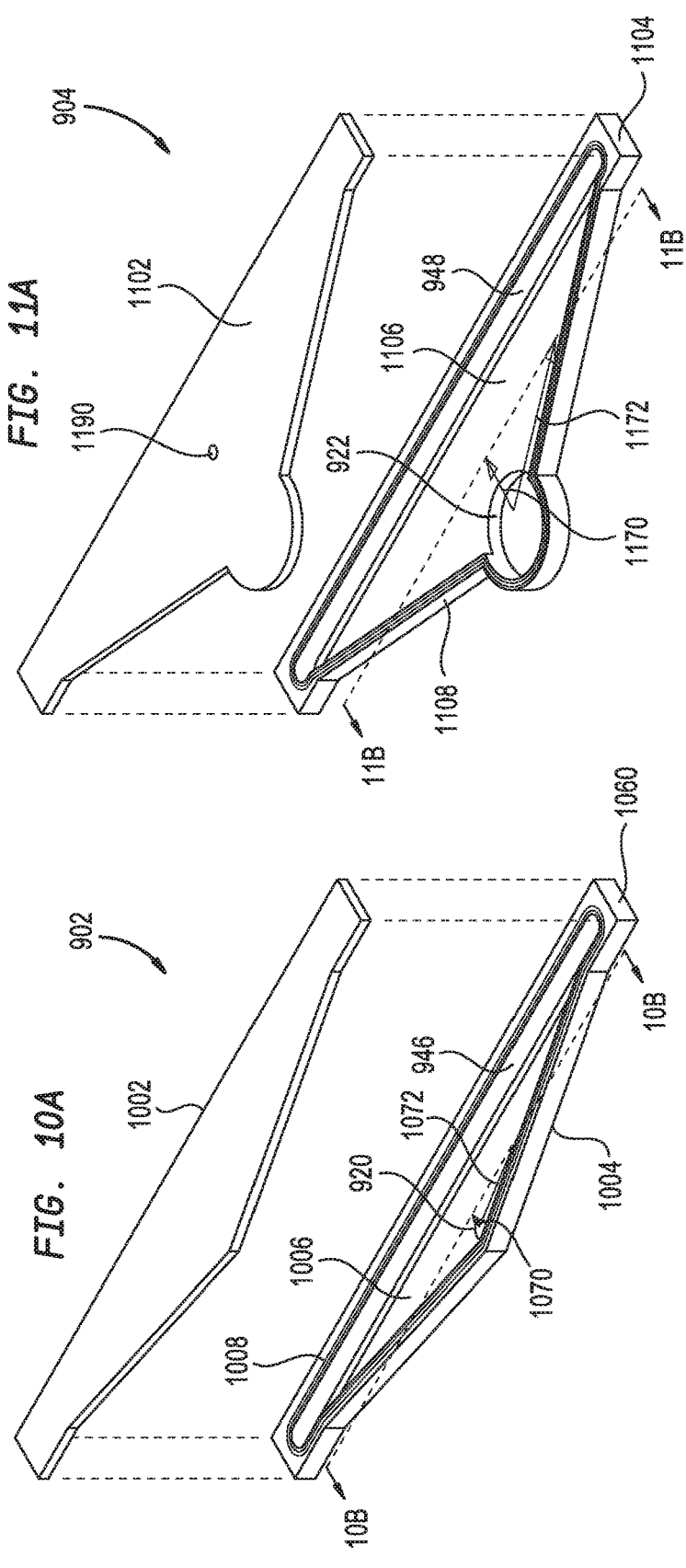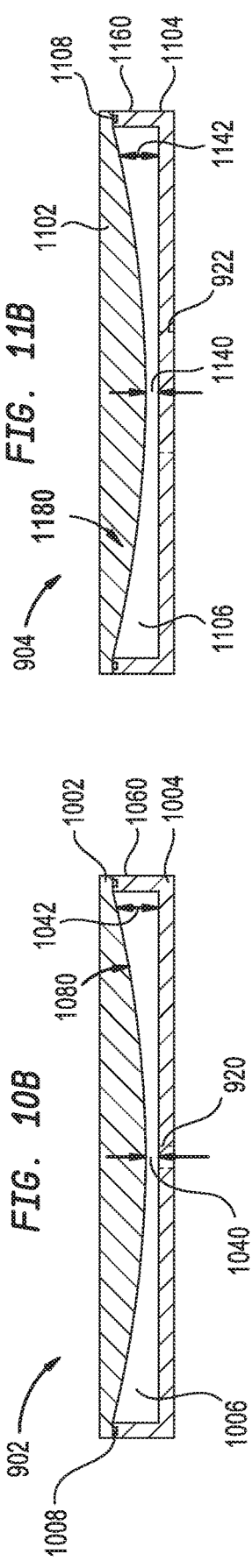

THIN FILM ENCAPSULATION PROCESSING SYSTEM AND PROCESS KIT

CROSS-REFERENCE TO RELATED APPLICATIONS

This application claims benefit of India provisional patent application serial number 201641041254, filed Dec. 2, 2016, which is herein incorporated by reference.

BACKGROUND

Field

Embodiments of the present disclosure generally relate to an apparatus for processing large area substrates. More particularly, embodiments of the present disclosure relate to an atomic layer deposition (ALD) system for device fabrication and in situ cleaning methods for a showerhead of the same.

Description of the Related Art

Organic light emitting diodes (OLED) are used in the manufacture of television screens, computer monitors, mobile phones, other hand-held devices, etc. for displaying information. A typical OLED may include layers of organic material situated between two electrodes that are all deposited on a substrate in a manner to form a matrix display panel having pixels that may be individually energized. The OLED is generally placed between two glass panels, and the edges of the glass panels are sealed to encapsulate the OLED therein.

The OLED industry, as well as other industries that utilize substrate processing techniques, must encapsulate moisture-sensitive devices to protect them from ambient moisture exposure. A thin conformal layer of material has been proposed as a means of reducing water vapor transmission rate (WVTR) through encapsulation layer(s). Currently, there are a number of ways this is being done commercially. Using an ALD process to cover a moisture-sensitive device is being considered to determine if the conformal nature of these coatings can provide a more effective moisture barrier than other coatings.

ALD is based upon atomic layer epitaxy (ALE) and employs chemisorption techniques to deliver precursor molecules on a substrate surface in sequential cycles. The cycle exposes the substrate surface to a first precursor and then to a second precursor. Optionally, a purge gas may be introduced between introductions of the precursors. The first and second precursors react to form a product compound as a film on the substrate surface. The cycle is repeated to form the layer to a desired thickness.

One method of performing ALD is by time-separated (TS) pulses of precursor gases. This method has several advantages over other methods, however one drawback of TS-ALD is that every surface (e.g., the interior of the chamber) exposed to the precursors will be coated with deposition. If these deposits are not removed periodically, they will tend to flake and peel off eventually, leading to particulates ending up on the substrate which degrades moisture barrier performance of the deposited layer. If there is no effective way to clean the undesired deposits from the chamber surfaces in situ, then those chamber surfaces must be removed for cleaning "off-line". If the chamber has to be opened to accomplish removing and replacing chamber surfaces for cleaning, then vacuum has to be broken in the chamber (e.g., the chamber is brought to atmospheric pressure) and this breaking of vacuum will lead to excessive chamber downtime.

There is a need, therefore, for a processing chamber allowing for removal and cleaning of the main key elements of the chamber which will accumulate extraneous deposits with minimal down-time.

SUMMARY

The present disclosure relates to methods and apparatus for a thin film encapsulation (TFE) on a device such as an OLED.

In one embodiment a process kit for use in an ALD chamber is disclosed and includes a dielectric window, a sealing frame, and a mask frame connected with the sealing frame, wherein the mask frame has a gas inlet channel and a gas outlet channel formed therein on opposing sides thereof.

In another embodiment, a process kit for use in an ALD chamber is disclosed and includes a dielectric window, a sealing frame, a mask frame connected with the sealing frame, wherein the mask frame has a gas inlet channel and a gas outlet channel formed therein on opposing sides thereof, and a mask sheet coupled to the mask frame.

In another embodiment, a processing system for performing ALD is provided. The processing system generally includes a chamber body, a susceptor body, a plurality of support members disposed about the susceptor body, at least one process gas inlet, at least one pumping port, and a process kit. The process kit generally includes a dielectric window, a sealing frame, and a mask frame connected with the sealing frame, wherein the mask frame has a gas inlet channel and a gas outlet channel formed therein on opposing sides thereof.

In another embodiment, a method for performing ALD is provided. The method generally includes positioning a substrate and a process kit within an ALD processing chamber, wherein the process kit includes a window, a mask disposed parallel to the window, and a frame connected with the window and the mask. The frame has at least one inlet channel and at least one outlet channel. The method further includes flowing process gases through the inlet channel into a volume and pumping excess gases out of the process kit through the outlet channel.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 3A-3C are various views of another embodiment of an ALD processing chamber.

FIG. 4A is an isometric exploded view of another embodiment of a process kit.

FIG. 4B is a cross-sectional view of the process kit along lines 4B-4B of FIG. 4A.

FIGS. 4C and 4D are partial enlarged views of opposing ends of the process kit shown in FIG. 4B.

FIG. 6A shows a processing chamber having a process kit and a substrate in a processing position.

FIG. 6B shows the substrate in a transfer position in the processing chamber.

FIG. 6C shows the substrate transferred out of the processing chamber and the process kit in a transfer position.

FIG. 8 is an isometric view of one embodiment of a mask alignment system.

FIG. 10A is an isometric view of a component of a process kit according to one embodiment.

FIG. 10B is a cross-section of the component of a process kit of FIG. 10A.

FIG. 11A is an isometric view of a component of a process kit according to one embodiment.

FIG. 11B is a cross-section of the component of a process kit of FIG. 11A.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
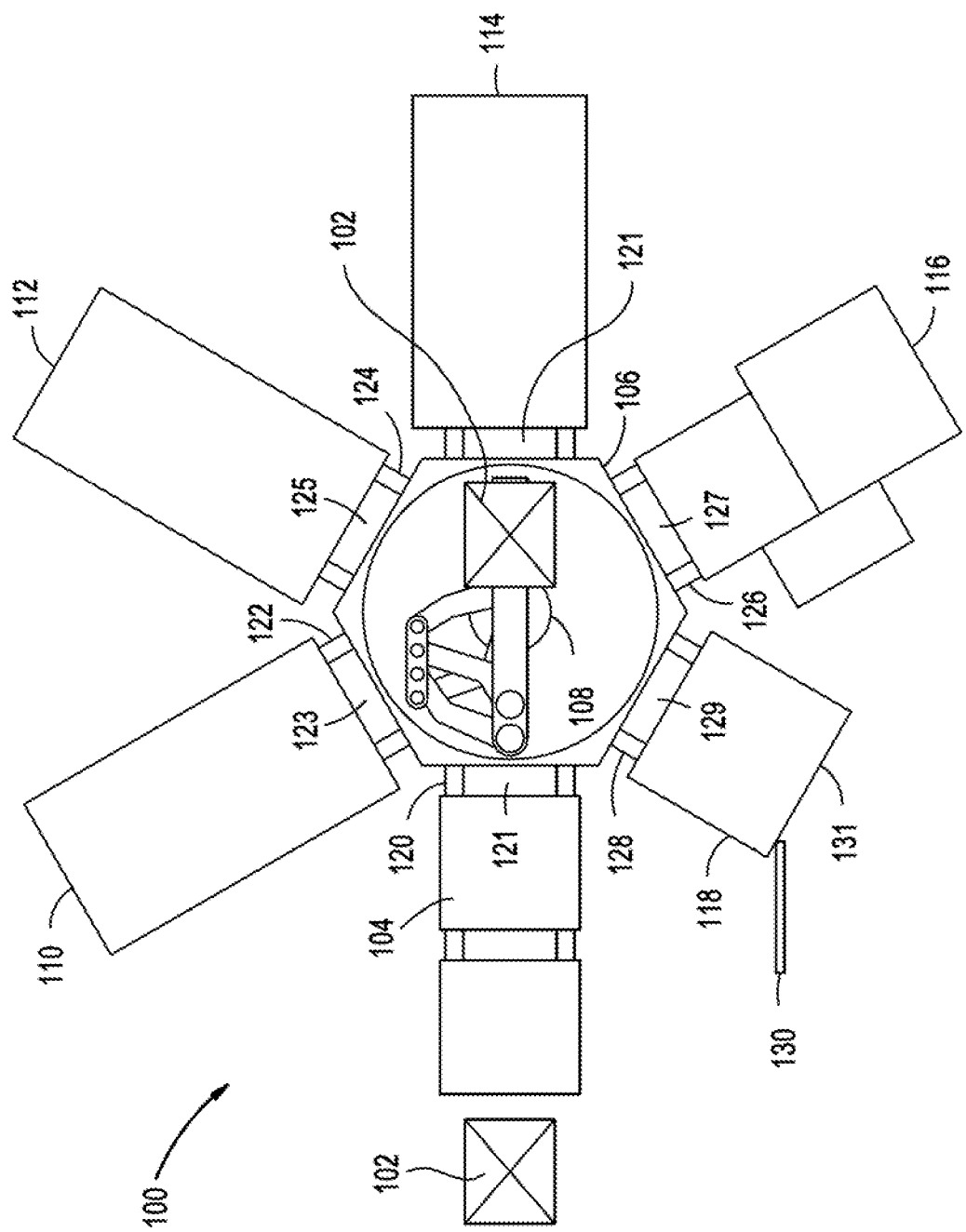
FIG. 1 illustrates an exemplary processing system, according to certain aspects of the present disclosure.

Embodiments of the present disclosure include a processing system that is operable to deposit a plurality of layers on a substrate, the plurality of layers capable of acting as an encapsulation layer on an OLED layer formed on the substrate. The system includes a plurality of processing chambers, with each processing chamber operable to deposit one or more of the plurality of layers. The processing system further includes at least one transfer chamber and at least one load lock chamber. The at least one transfer chamber enables transfer of substrates between the plurality of processing chambers without breaking vacuum in the processing system. The at least one load lock chamber enables loading and removal of substrates from the processing system without breaking vacuum in the processing system. The processing system further includes a mask chamber that enables loading and removal of masks used in the processing chambers without breaking vacuum in the processing system.

Embodiments of the disclosure include chemical vapor deposition (CVD) processing chambers that are operable to align a mask with respect to a substrate, position the mask on the substrate, and perform CVD to deposit an encapsulation layer on an OLED formed on the substrate. The CVD process performed in the CVD processing chambers may be plasma-enhanced CVD (PECVD), but the embodiments described herein may be used with other types of processing chambers and are not limited to use with PECVD processing chambers. The encapsulation layers deposited by the CVD processing chambers may comprise silicon nitride SiN, but the embodiments described herein may be used with other types of processing chambers and are not limited to use with SiN CVD processing chambers.

Embodiments of the disclosure include an ALD processing chamber that is operable to align a mask with respect to a substrate, position the mask on the substrate, and perform ALD to deposit an encapsulation layer on an OLED formed on the substrate. The ALD process performed in the ALD processing chamber may be time-separated ALD (TS-ALD), but the embodiments described herein may be used with other types of processing chambers and are not limited to use with TS-ALD processing chambers. The encapsulation layers deposited by the ALD processing chambers may comprise aluminum oxide $Al_2O_3$, but the embodiments described herein may be used with other types of processing chambers and are not limited to use with SiN CVD processing chambers.

The embodiments described herein may be used with other types of deposition processes and are not limited to use for encapsulating OLEDs formed on substrates. The embodiments described herein may be used with various types, shapes, and sizes of masks and substrates.

The substrate is not limited to any particular size or shape. In one aspect, the term "substrate" refers to any polygonal, squared, rectangular, curved or otherwise non-circular workpiece, such as a glass or polymer substrate used in the fabrication of flat panel displays, for example.

In the description that follows, the terms "gas" and "gases" are used interchangeably, unless otherwise noted, and refer to one or more precursors, reactants, catalysts, carrier gases, purge gases, cleaning gases, effluent, combinations thereof, as well as any other fluid.

FIG. 1 is a cross sectional top view showing an illustrative processing system 100, according to one embodiment of the present disclosure. An exemplary substrate 102 is shown adjacent to the processing system 100. The processing system 100 includes a load lock chamber 104, a transfer chamber 106, a transfer (e.g., tool and material handling) robot 108 within the transfer chamber 106, a first CVD processing chamber 110, a second CVD processing chamber 112, a third CVD processing chamber 114, an ALD processing chamber 116, and a mask chamber 118. The first CVD processing chamber 110, second CVD processing chamber 112, ALD processing chamber 116, and each chamber's associated hardware are preferably formed from one or more process-compatible materials, such as aluminum, anodized aluminum, nickel plated aluminum, carbon steel, stainless steel, quartz, and combinations and alloys thereof, for example. The first CVD processing chamber 110, second CVD processing chamber 112, third CVD processing chamber 114 and ALD processing chamber 116 may be round, rectangular, or another shape, as required by the shape of the substrate to be coated and other processing requirements.

The transfer chamber 106 includes slit valve openings 121, 123, 125, 127, 129 in sidewalls adjacent to the load lock chamber 104, first CVD processing chamber 110, second CVD processing chamber 112, third CVD processing chamber 114, ALD processing chamber 116, and mask chamber 118. The transfer robot 108 is positioned and configured to be capable of inserting one or more tools (e.g., substrate handling blades) through each of the slit valve openings 121, 123, 125, 127, 129 and into the adjacent chamber. That is, the transfer robot can insert tools into the load lock chamber 104, the first CVD processing chamber 110, the second CVD processing chamber 112, the third CVD processing chamber 114, the ALD processing chamber 116, and the mask chamber 118 via slit valve openings 121, 123, 125, 127, 129 in the walls of the transfer chamber 106 adjacent to each of the other chambers. The slit valve openings 121, 123, 125, 127, 129 are selectively opened and closed with slit valves 120, 122, 124, 126, 128 to allow access to the interiors of the adjacent chambers when a substrate, mask, tool, or other item is to be inserted or removed from one of the adjacent chambers.

The transfer chamber 106, load lock chamber 104, first CVD processing chamber 110, second CVD processing chamber 112, ALD processing chamber 116, and mask chamber 118 include one or more apertures (not shown) that are in fluid communication with a vacuum system (e.g., a vacuum pump). The apertures provide an egress for the gases within the various chambers. In some embodiments, the chambers are each connected to a separate and independent vacuum system. In still other embodiments, some of the chambers share a vacuum system, while the other chambers have separate and independent vacuum systems. The vacuum systems can include vacuum pumps (not shown) and throttle valves (not shown) to regulate flows of gases through the various chambers.

Masks, mask sheets, and other items placed within the first CVD chamber 110, second CVD chamber 112, and ALD processing chamber 116, other than substrates, may be referred to as a "process kit." Process kit items may be removed from the processing chambers for cleaning or replacement. The transfer chamber 106, mask chamber 118, first CVD processing chamber 110, second CVD processing chamber 112, and ALD processing chamber 116 are sized and shaped to allow the transfer of masks, mask sheets, and other process kit items between them. That is, the transfer chamber 106, mask chamber 118, first CVD processing chamber 110, second CVD processing chamber 112, and ALD processing chamber 116 are sized and shaped such that any process kit item can be completely contained within any one of them with all of the slit valve openings 121, 123, 125, 127, 129 closed by each slit valve opening's 121, 123, 125, 127, 129 corresponding slit valve 120, 122, 124, 126, 128. Thus, process kit items may be removed and replaced without breaking vacuum of the processing system, as the mask chamber 118 acts as an airlock, allowing process kit items to be removed from the processing system without breaking vacuum in any of the chambers other than the mask chamber. Furthermore, the slit valve opening 129 between the transfer chamber 106 and the mask chamber 118, the slit valve openings 123, 125 between the transfer chamber 106 and the CVD processing chambers 110, 112, and the slit valve opening 127 between the transfer chamber 106 and the ALD processing chamber 116 are all sized and shaped to allow the transfer of process kit items between the transfer chamber 106 and the mask chamber 118, CVD processing chambers 110, 112, and ALD processing chamber 116.

The mask chamber 118 has a door 130 and doorway 131 on the side of the mask chamber 118 opposite the slit valve opening 129 of the transfer chamber 106. The doorway is sized and shaped to allow the transfer of masks and other process tools into and out of the mask chamber 118. The door 130 is capable of forming an air-tight seal over the doorway 131 when closed. The mask chamber 118 is sized and shaped to allow any process kit item to be completely contained within the mask chamber 118 with both the door 130 closed and the slit valve 128 leading to the transfer chamber 106 closed. That is, the mask chamber 118 is sized and shaped such that any process kit item can be moved from the transfer chamber 106 into the mask chamber 118 and the slit valve 128 can be closed without the door 130 of the mask chamber 118 being opened.

For simplicity and ease of description, an exemplary coating process performed within the processing system 100 will now be described. The exemplary coating process is controlled by a process controller, which may be a computer or system of computers that may be located at the third CVD processing chamber 114.

Referring to FIG. 1, the exemplary processing of a substrate optionally begins with the transfer robot 108 retrieving a mask from the mask chamber 118 and placing the mask in the ALD processing chamber 116. Placing a mask in the ALD processing chamber 116 is optional because a mask may be left in the ALD processing chamber 116 from earlier processing, and the same mask may be used in processing multiple substrates. Similarly, the transfer robot 108 may optionally retrieve other masks from the mask chamber 118 and place the masks in the first and second CVD processing chambers 110 and 112. In placing masks within the first and second CVD processing chambers 110, 112 and the ALD processing chamber 116, the appropriate slit valves 122, 124, 126, 128 between the chambers may be opened and closed.

Next, the transfer robot 108 retrieves a substrate from the load lock chamber 104 and places the substrate in the first CVD processing chamber 110. The process controller controls valves, actuators, and other components of the processing chamber to perform the CVD processing. The process controller causes the slit valve 122 to be closed, isolating the first CVD processing chamber 110 from the transfer chamber 106. The process controller also causes a substrate support member, or susceptor, to position the substrate for CVD processing. If the mask was not placed into the correct processing position by the transfer robot, then the process controller may activate one or more actuators to position the mask. Alternatively or additionally, the susceptor may also position the mask for processing. The mask is used to mask off certain areas of the substrate and prevent deposition from occurring on those areas of the substrate.

The process controller now activates valves to start the flow of precursor and other gases into the first CVD processing chamber 110. The precursor gases may include silane $SiH_4$, for example. The process controller controls heaters, plasma discharge components, and the flow of gases to cause the CVD process to occur and deposit layers of materials on the substrate. In one embodiment, the deposited layer may be silicon nitride SiN, although embodiments of the disclosure are not limited to this material. As noted above, embodiments of the disclosure may also be used to perform PECVD. The CVD process in the exemplary processing of the substrate is continued until the deposited layer reaches the required thickness. In one exemplary embodiment, the required thickness is 5,000 to 10,000 Angstroms (500 to 1,000 nm).

When the CVD process in the first CVD processing chamber 110 is complete, the process controller causes the first CVD processing chamber 110 vacuum level to match the vacuum level of the transfer chamber 106 and then controls the susceptor to lower the substrate to a transfer position. The process controller also causes the slit valve 122 between the first CVD processing chamber 110 and the transfer chamber 106 to be opened and then directs the transfer robot 108 to retrieve the substrate from the first CVD processing chamber 110. The process controller then causes the slit valve 122 between first CVD processing chamber 110 and the transfer chamber 106 to be closed.

Next, the process controller causes the slit valve 126 between the transfer chamber 106 and the ALD processing chamber 116 to be opened. The transfer robot 108 places the substrate in the ALD processing chamber 116, and the process controller causes the slit valve 126 between the transfer chamber 106 and the ALD processing chamber 116 to be closed. The process controller also causes a substrate support member, or susceptor, to position the substrate for ALD processing. If the mask was not placed into the correct processing position by the transfer robot, then the process controller may activate one or more actuators to position the mask. Alternatively or additionally, the susceptor may position the mask for processing. The mask is used to mask off certain areas of the substrate and prevent deposition from occurring on those areas of the substrate.

The process controller now activates valves to start the flow of precursor and other gases into the ALD processing chamber 116. The particular gas or gases that are used depend upon the process or processes to be performed. The gases can include trimethylaluminium $(CH_3)_3Al$ (TMA), nitrogen $N_2$, and oxygen $O_2$, however, the gases are not so limited and may include one or more precursors, reductants, catalysts, carriers, purge gases, cleaning gases, or any mixture or combination thereof. The gases may be introduced into the ALD processing chamber from one side and flow across the substrate. Depending on requirements of the processing system, the process controller may control valves such that only one gas is introduced into the ALD processing chamber at any particular instant of time. In other embodiments, a $ZrO_2$ film formation process may be performed in the ALD processing chamber 116 with a precursor such as TEMAZ (tetrakis ethyl methyl amino zirconium, $Zr[N(CH_3)(C_2H_5)]_4$).

The process controller also controls a power source capable of activating the gases into reactive species and maintaining the plasma of reactive species to cause the reactive species to react with and coat the substrate. For example, radio frequency (RF) or microwave (MW) based power discharge techniques may be used. The activation may also be generated by a thermally based technique, a gas breakdown technique, a high intensity light source (e.g., UV energy), or exposure to an x-ray source. In the exemplary process, oxygen is activated into a plasma, and the plasma reacts with and deposits a layer of oxygen on the substrate. The process controller then causes TMA to flow across the substrate, and the TMA reacts with the layer of oxygen on the substrate, forming a layer of aluminum oxide on the substrate. The process controller causes repetition of the steps of flowing oxygen, activating oxygen into a plasma, and flowing TMA to form additional layers on the substrate. The process controller continues repeating the described steps until the deposited layer of aluminum oxide is the required thickness. In one exemplary embodiment, the required thickness is 500 to 700 Angstroms (50 to 70 nm).

When the ALD process in the ALD processing chamber 116 is complete, the process controller causes the ALD processing chamber 116 to be evacuated and then controls the susceptor to lower the substrate to a transfer position. The process controller also causes the slit valve 126 between the ALD processing chamber 116 and the transfer chamber 106 to be opened and then directs the transfer robot 108 to retrieve the substrate from the ALD processing chamber 116. The process controller then causes the slit valve 126 between ALD processing chamber 116 and the transfer chamber 106 to be closed.

Still referring to FIG. 1, next, the process controller causes the slit valve 124 between the transfer chamber 106 and the second CVD processing chamber 112 to be opened. The transfer robot 108 places the substrate in the second CVD processing chamber 112, and the process controller causes the slit valve 124 between the transfer chamber 106 and the second CVD processing chamber 112 to be closed. Processing in the second CVD processing chamber 112 is similar to the processing in the first CVD processing chamber 110 described above. In the exemplary processing of the substrate, the CVD process performed in the second CVD processing chamber 112 is continued until the deposited layer reaches the desired thickness. In one exemplary embodiment, the desired thickness is 5,000 to 10,000 Angstroms (500 to 1,000 nm).

Thus, when the process in the second CVD processing chamber 112 is complete, the substrate will be coated with a first layer of SiN that is 5,000 to 10,000 Angstroms thick, a layer of $Al_2O_3$ that is 500 to 700 Angstroms thick, and a second layer of SiN that is 5,000 to 10,000 Angstroms thick. The layer of $Al_2O_3$ is believed to lower the water vapor transfer rate through the encapsulation layer, as compared to SiN alone, thus improving the reliability of the encapsulation, as compared to encapsulating with SiN alone.

In the exemplary process described above with reference to FIG. 1, each of the CVD processing chambers 110, 112 and the ALD processing chamber 116 is loaded with a mask. Alternatively, the processing system 100 may perform a process wherein a mask moves with a substrate from processing chamber to processing chamber. That is, in a second exemplary process, a substrate and mask are placed (simultaneously or individually) in the first CVD processing chamber 110, and the slit valve 122 between the transfer chamber 106 and the first processing chamber 110 is closed. A CVD process is then performed on the substrate. The substrate and mask are then moved (simultaneously or individually) into the ALD processing chamber 116, and the slit valve 126 between the transfer chamber and the ALD processing chamber 116 is closed. An ALD process is then performed on the substrate. The substrate and mask are then moved (simultaneously or individually) into the second CVD processing chamber 112. A CVD process is then performed on the substrate, and the substrate and mask are then removed from the second CVD processing chamber 112. The substrate may be removed from the processing system 100, if complete, and the mask may be used for processing a new substrate or removed from the processing system 100 for cleaning, for example.

Figure 2:
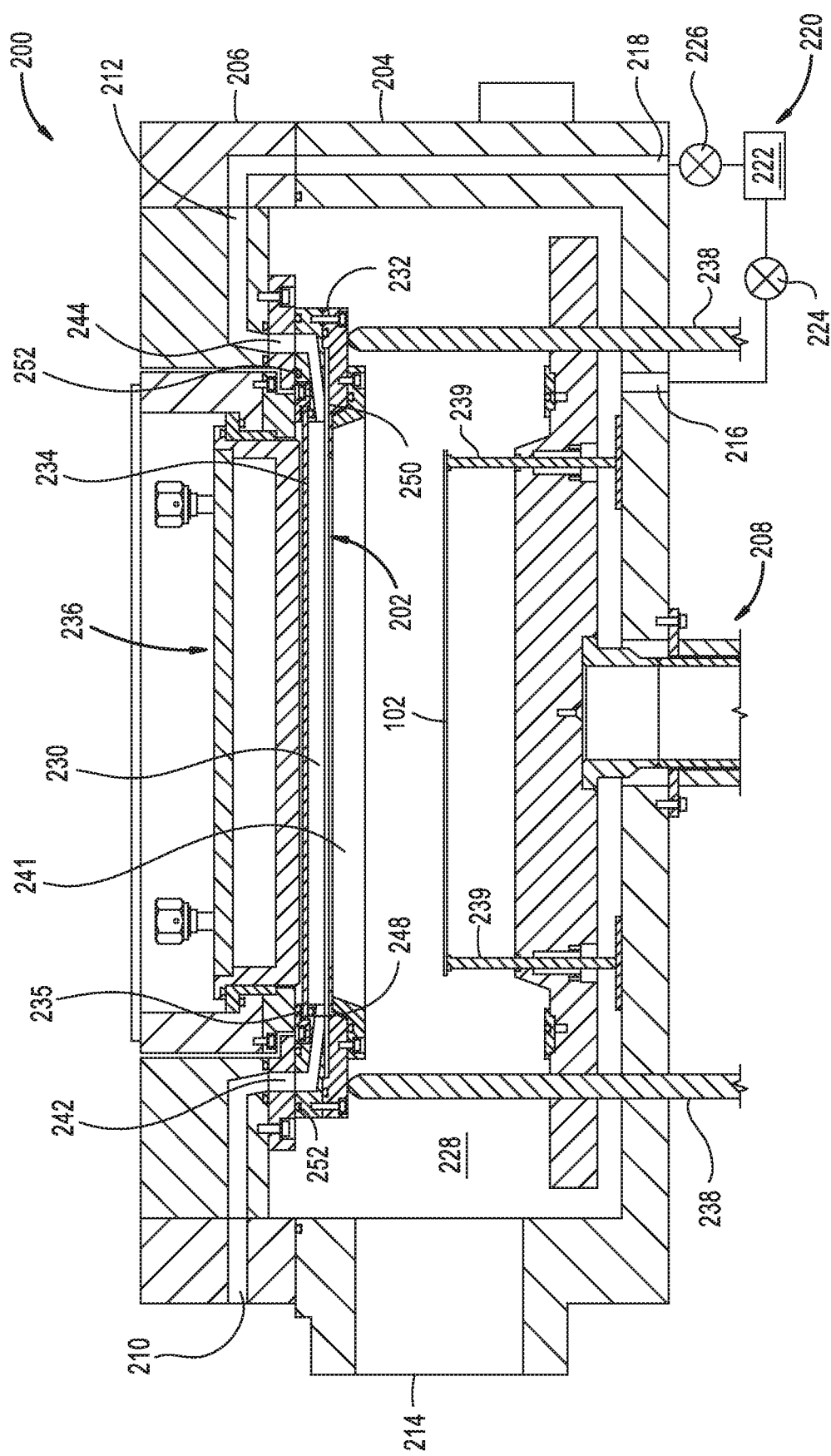
FIG. 2 is a partial cross sectional side view showing an illustrative ALD processing chamber.

FIG. 2 is a partial cross sectional side view showing an illustrative ALD processing chamber 200 with a process kit 202 according to embodiments described herein. The ALD processing chamber 200 shown in FIG. 2 is similar to the ALD processing chamber 116 shown in FIG. 1. In one embodiment, the processing chamber 200 includes a chamber body 204, a lid assembly 206, a susceptor or substrate support assembly 208, a process gas inlet 210 and a pumping port 212. The lid assembly 206 is disposed at an upper end of the chamber body 204, and the substrate support assembly 208 is at least partially disposed within the chamber body 204.

The chamber body 204 includes a slit valve opening 214 formed in a sidewall thereof to provide access to the interior of the processing chamber 200. As described above with reference to FIG. 1, the slit valve opening 214 is selectively opened and closed to allow access to the interior of the chamber body 204 by a transfer robot (see FIG. 1).

In one or more embodiments, the chamber body 204 includes one or more apertures 216 and 218 that are in fluid communication with a vacuum system 220. The vacuum system 220 includes a vacuum pump 222 and one or more valves 224 and 226. The aperture 216 provides an egress for gases within the processing chamber 200 while the aperture 218 provides a pathway for gases from the pumping port 212. The vacuum system 220 is controlled by a process controller to maintain a pressure within the ALD processing chamber suitable for the ALD process. The vacuum system 220 may be used to maintain a first pressure in an interior volume 228 of the processing chamber 200. The vacuum system 220 may also be used to maintain a second pressure within a volume 230 defined within the process kit 202 (described in greater detail below). In one embodiment of the present disclosure, the first pressure may be less than the second pressure.

The process kit 202 is movable within the interior volume 228 of the processing chamber 200. The process kit 202 includes at least a mask frame 232 that includes a dielectric window 234. The process kit 202 may also include a sealing frame 235 that secures the dielectric window 234 to the mask frame 232. The lid assembly 206 includes a radio frequency (RF) cathode 236 that can generate a plasma of reactive species within the processing chamber 200 and/or within the process kit 202. The process kit 202 may be selectively raised and lowered by support members 238. The support members 238 may also serve as alignment and/or positioning devices for the process kit 202. A substrate 102 is shown supported by lift pins 239 movably disposed in the substrate support assembly 208. The substrate 102 is shown in a transfer position in FIG. 2 such that a robot handling blade (not shown) may access a surface of the substrate 102 opposing the substrate support assembly 208. In a processing position, the substrate 102 may be raised by the substrate support assembly 208 to a position adjacent to the process kit 202. Specifically, the substrate 102 is adapted to be in contact with, or in proximity to a mask sheet 241, coupled to the mask frame 232.

In the view shown in FIG. 2, the process kit 202 is urged by the support members 238 to contact a surface of the lid assembly 206 and/or position the dielectric window 234 in proximity to the RF cathode 236. Specifically, when the process kit 202 is urged against a lower surface of the lid assembly 206, a gas inlet 242 and a gas outlet 244 coupled to the process gas inlet 210 and the pumping port 212, respectively, are positioned to be in fluid communication with an inlet gas channel 248 and an outlet gas channel 250, respectively. The mask frame 232 includes a compressible seal 252 that surrounds the interface between the inlet gas channel 248 and the outlet gas channel 250, and the gas inlet 242 and the gas outlet 244, respectively. In this manner, the precursor gases may be provided to the process gas inlet 210 and to the volume 230 through the inlet gas channel 248 formed in the mask frame 232. The gases may flow in the volume 230 across the mask sheet 241 and the substrate 102 to be exhausted by the outlet gas channel 250 formed in the mask frame 232. The exhausted gases may flow to the vacuum system 220 through the pumping port 212.

It may be possible to control film properties, such as film stress. In one embodiment, film stress can be controlled by the spacing between the RF cathode 236 and the substrate 102 on the substrate support assembly 208. In other embodiments, film properties may be modified and/or controlled by modifying the lower surface of the RF cathode 236. For example, "scooping" the lower surface of the RF cathode 236 (i.e., thinner cross-section at the center of the RF cathode 236 while thicker at the edges thereof) may be effective to improve stress uniformity.

Temperature of the RF cathode 236 may be controlled (by, e.g., a process controller) during processing in the ALD processing chamber 200. Control of the temperature may be utilized to influence temperature of the process kit 202 and the substrate 102 and improve performance of the ALD processing. The temperature of the RF cathode 236 may be measured by a pyrometer (not shown), for example, or other sensor in the ALD processing chamber 200. The RF cathode 236 may be heated by electric heating elements (not shown), for example, and cooled by circulation of cooling fluids, for example, a heat transfer fluid marketed under the tradename GALDEN®. Any power source capable of activating the gases into reactive species and maintaining the plasma of reactive species may be used. For example, radio frequency (RF) or microwave (MW) based power discharge techniques may be used. The activation may also be generated by a thermally based technique, a gas breakdown technique, a high intensity light source (e.g., UV energy), or exposure to an x-ray source.

As discussed above, the pressures in the interior volume 228 of the processing chamber 200 and the volume 230 of the process kit 202 may be different, at least during ALD processing. In one example, the vacuum system 220 may maintain a first pressure within the interior volume 228 of the processing chamber 200 a second pressure within the volume 230, the second pressure being greater than the first pressure. In some embodiments, the first pressure may be about 0.3 to about 0.2 Torr while the second pressure may be about 100 mTorr greater than the first pressure.

FIGS. 3A-3C are various views of another embodiment of an ALD processing chamber 300. FIG. 3A is a cross sectional view of the ALD processing chamber 300 with a process kit 202 according to embodiments described herein. The ALD processing chamber 300 shown in FIG. 3A is similar to the ALD processing chamber 116 shown in FIG. 1. In FIGS. 3A-3C, the substrate 102 as well as the process kit 202 are shown in a processing position. In this position, process gases such as TMA, TEMAZ, oxygen, carbon dioxide, or combinations thereof, may be flowed through the volume 230 from the process gas inlet 210 to the pumping port 212. The process gases may be flowed continuously or pulsed through the volume 230 to flow across the substrate 102 and the mask sheet 241. In one embodiment, the volume 230 formed between the dielectric window 234 and the substrate 102 forms a reaction chamber within the interior volume 228 of the processing chamber 300.

FIG. 4A is an isometric exploded view of another embodiment of a process kit 400 that may be used as the process kit 202 described above. The process kit 400 includes the mask frame 232 and the dielectric window 234. The process kit 400 may also include the sealing frame 235 which couples the dielectric window 234 to the mask frame 232. The sealing frame 235 may be coupled to the mask frame 232 by fasteners (not shown), such as bolts or screws. A ring seal 405 may be provided between the sealing frame 235 and the mask frame 232. The mask frame 232 also includes the compressible seal 252 on opposing sides thereof. In some embodiments, the process kit 400 includes the mask sheet 241. The mask sheet 241 may be coupled to the mask frame 232 by fasteners (not shown), such as bolts or screws. The mask sheet 241 includes a plurality of apertures 410 formed through major sides thereof.

The process kit 400 may also include an inlet manifold 415 and an outlet manifold 420. The inlet manifold 415 and the outlet manifold 420 are positioned on opposing sides of the mask frame 232. The inlet manifold 415 and the outlet manifold 420 may be received in a respective channel 425 formed in the mask frame 232.

The sealing frame 235, the inlet manifold 415 and outlet manifold 420 may be made of metallic materials, such as aluminum. The mask frame 232 and the mask sheet 241 may be made of a metallic material with a low coefficient of thermal expansion (CTE), such as an alloy of iron and nickel (FeNi), which may be marketed under the tradename "INVAR" or "INVAR 36". The dielectric window 234 may be made of quartz, a borosilicate glass material or a tempered glass material. The ring seal 405 and the compressible seal 252 may be made of a polymeric material, such as polytetrafluoroethylene (PTFE) or other type of elastic and/or compressible polymer material.

FIG. 4B is a cross-sectional view of the process kit 400 along lines 4B-4B of FIG. 4A. FIGS. 4C and 4D are partial enlarged views of ends of the process kit 400 shown in FIG. 4B.

As shown in FIGS. 4C and 4D, the compressible seal 252 surrounds the channel 425 on opposing sides of the mask frame 232. The inlet manifold 415 is shown in the channel 425 in FIG. 4C and the outlet manifold 420 is shown in the channel 425 in FIG. 4D. An inlet orifice 430 is shown in FIG. 4C that fluidly couples the inlet manifold 415 to the volume 230. An outlet orifice 435 is shown in FIG. 4D that fluidly couples the volume 230 to the outlet manifold 420. In some embodiments, intermediate volumes 440 are provided between the volume 230 and the orifices 430 and 435. In embodiments where the mask sheet 241 is utilized with the process kit 400, an upper surface 445 of the mask sheet 241 bounds one side of the intermediate volumes 440. A lower surface 450 of the mask sheet 241 is adapted to contact a substrate (not shown).

The compressible seal 252 may include a compressible portion 455 coupled to a mounting portion 460. The mounting portion 460 may be received in a keyway 465 formed in the mask frame 232. The compressible seal 252 according to this embodiment may provide improved sealing as a large portion of the compressible portion 455 extends from an upper surface 470 of the mask frame 232 (as compared to conventional circular seals or O-rings where a great portion of the O-ring is positioned in an O-ring groove).

Figure 5B:
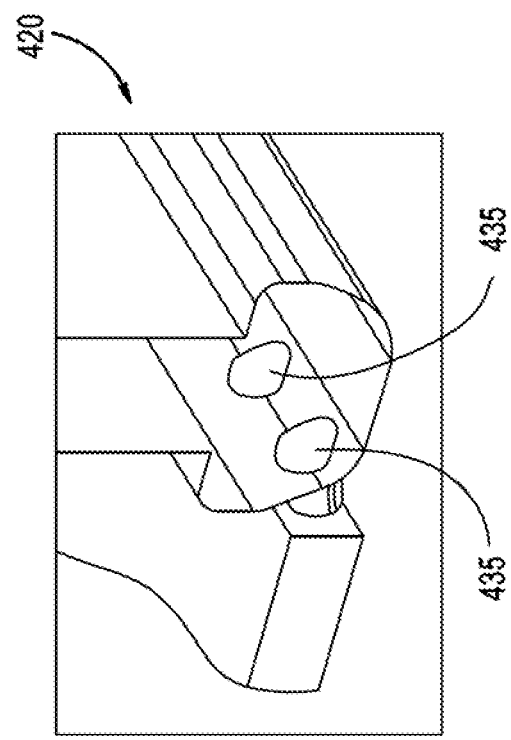
FIGS. 5A and 5B are isometric cross-sectional views of portions of the inlet manifold and the outlet manifold, respectively.
Figure 5A:
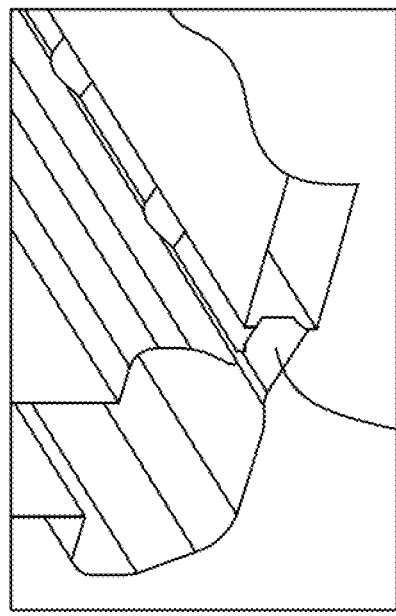

FIGS. 5A and 5B are isometric cross-sectional views of portions of the inlet manifold 415 and the outlet manifold 420, respectively. According to one embodiment, the inlet manifold 415 and the outlet manifold 420 include multiple inlet orifices 430 and outlet orifices 435, respectively.

FIGS. 6A-6C are various cross-sectional views of an exemplary processing chamber 600. The processing chamber 600 shown in FIGS. 6A-6C may be similar to the ALD processing chamber 200 shown in FIG. 2. An exemplary process kit 605 is shown in FIGS. 6A-6C. The process kit 605 may be configured similarly to the process kit 202 or the process kit 400 both described above.

FIG. 6A shows the process kit 605 and a substrate 102 in a processing position. A susceptor body 610 of the substrate support assembly 208 is lifted to a position adjacent to the RF cathode 236. The processing position may be similar to the embodiment described in FIG. 3.

FIG. 6B shows the susceptor body 610 of the substrate support assembly 208 lowered in the processing chamber 600. An upper portion of the lift pins 239 are shown supporting the substrate 102 in a transfer position. Lowering the susceptor body 610 of the substrate support assembly 208 promotes contact of the lift pins 239 with a bottom surface of the processing chamber 600. The lift pins 239 are movably disposed in the susceptor body 610 such that lowering thereof spaces the substrate 102 from the susceptor body 610. The substrate 102, supported by the lift pins 239, may be at an elevation in the processing chamber 600 where a transfer robot (not shown) may access the substrate 102 through the opening 214.

FIG. 6C shows the substrate 102 transferred out of the processing chamber 600. The support members 238, which support the process kit 605, are lowered such that the process kit 605 is in a transfer position. The process kit 605, supported by the support members 238, may be at an elevation in the processing chamber 600 where a transfer robot (not shown) may access the process kit 605 through the opening 214.

Figure 7:
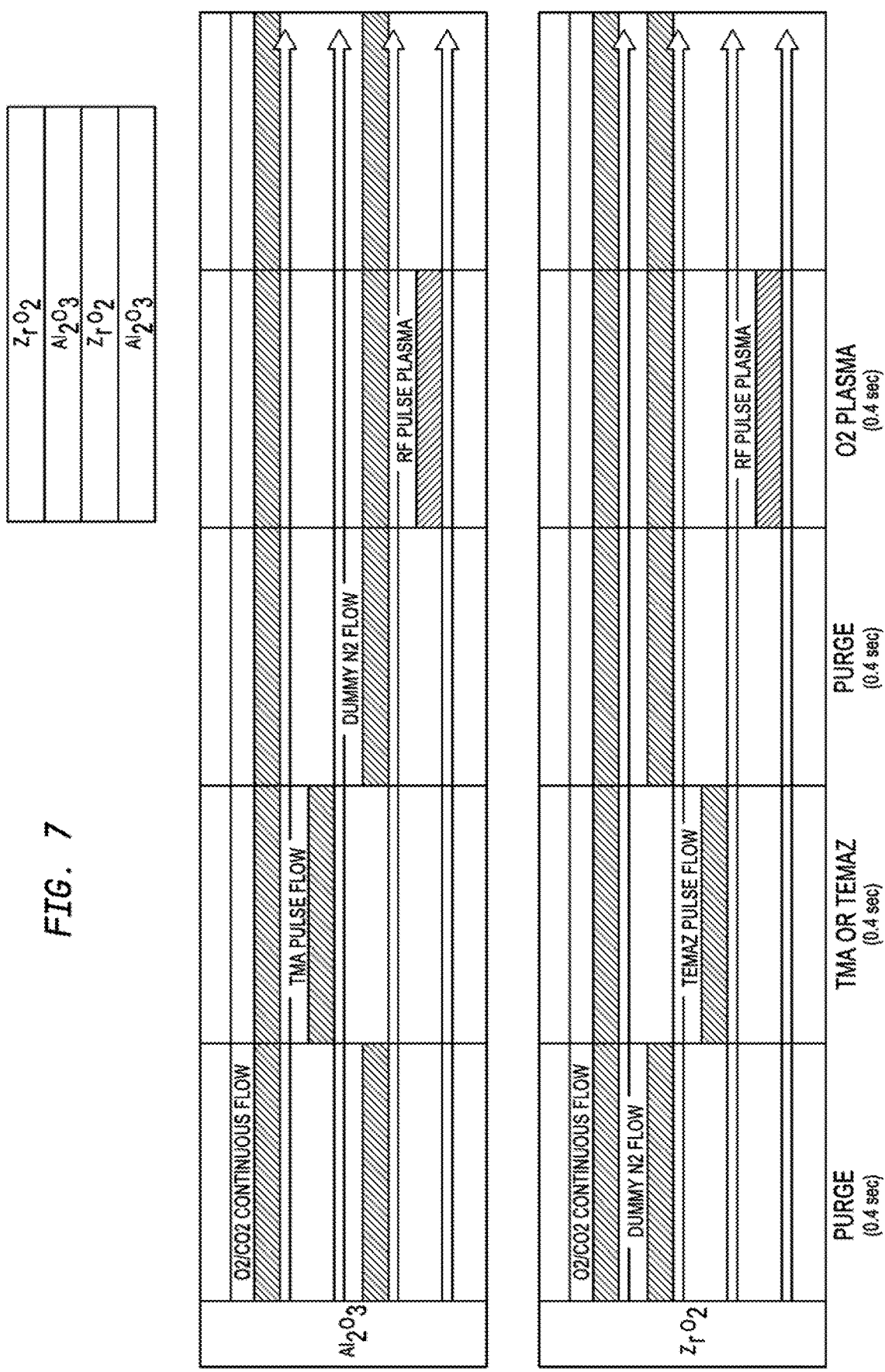
FIG. 7 is a diagram showing embodiments of a process sequence according to the disclosure.

FIG. 7 is a diagram showing embodiments of a process sequence according to the disclosure. The process sequence may be performed by flowing continuous oxygen/carbon dioxide in a planar RF plasma though the volume 230 of the process kit as described herein.

FIG. 8 is an isometric view of one embodiment of a mask alignment system. The mask alignment system may also be utilized as a reaction chamber alignment system (i.e., the process kit 202 as described herein).

The mask frame is structured and designed to be supported by four support members 238 which can move X & Y direction for the alignment and Z-direction for mask replacement. The mask frame has mask sheet, and mask sheet is aligned against a substrate fiducial mark (display pattern) by a vision (camera) system.

The alignment system includes one or more X-Y tables with a lift mechanism. The X-Y table moves each of the support members 238 laterally as well as vertically (up or down). The X-Y table may move each of the support members 238 independently or collectively.

Figure 9B:
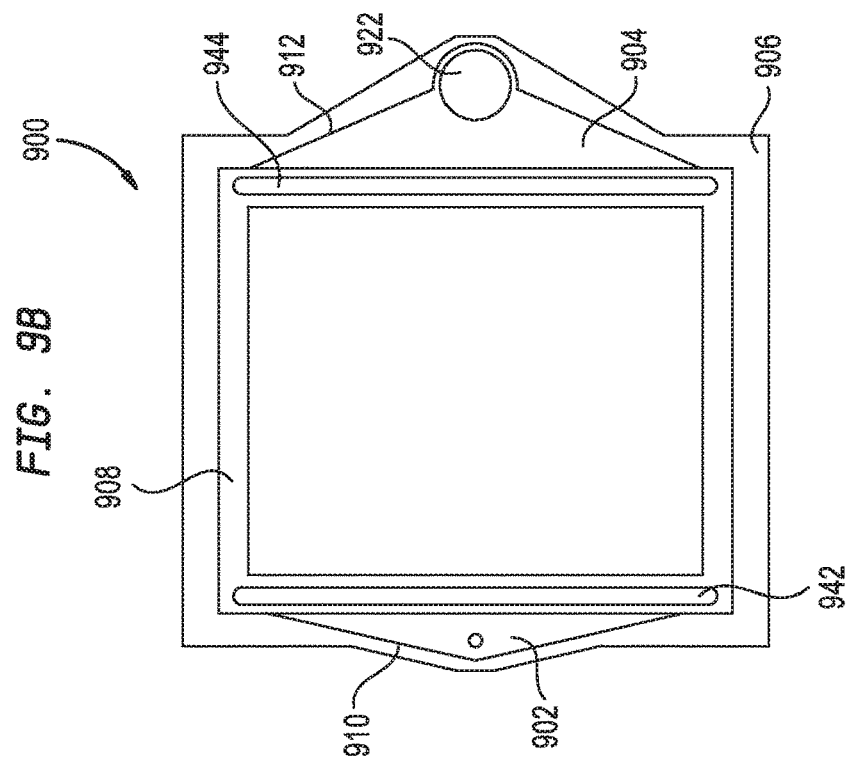
FIG. 9B is a plan view of a process kit for according to one embodiment.
Figure 9A:
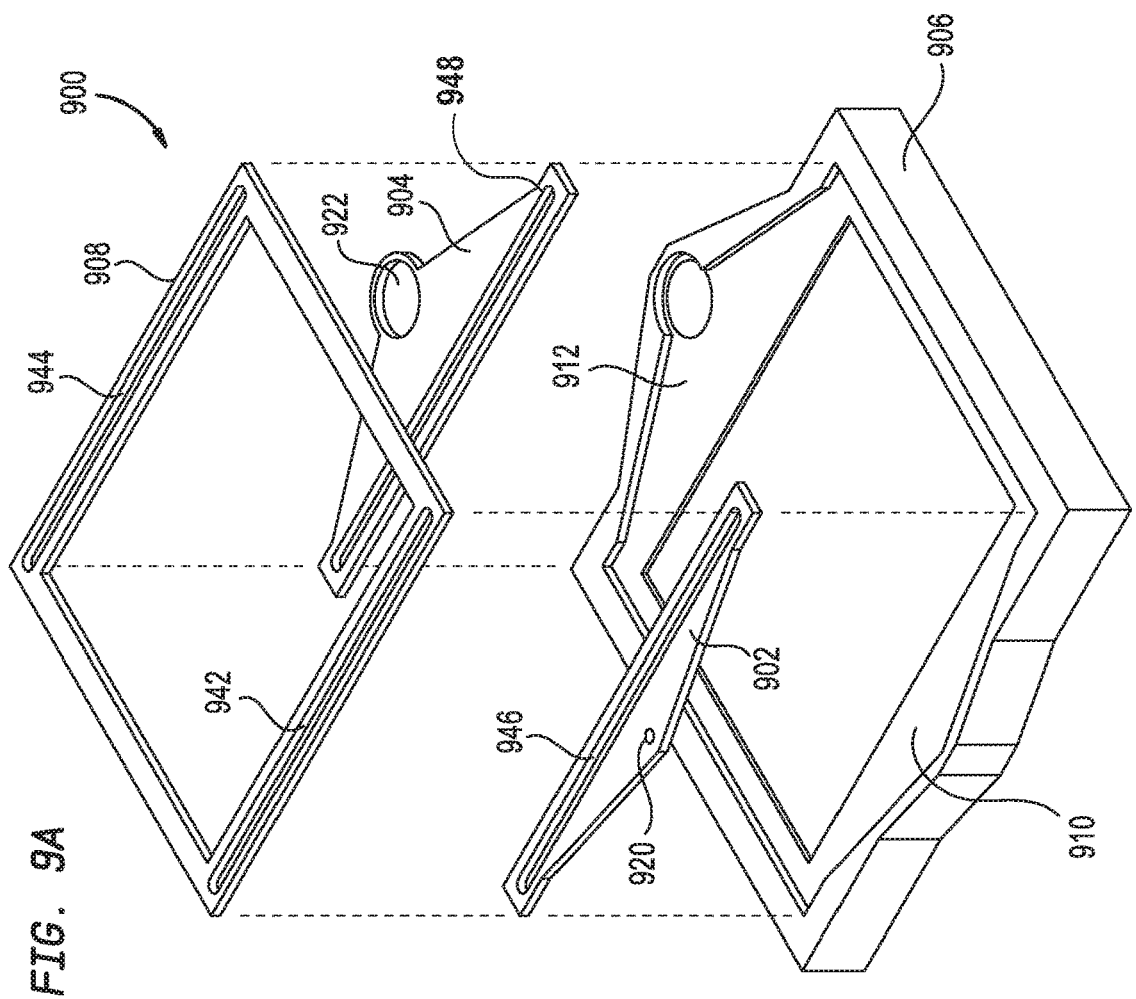
FIG. 9A is an isometric, exploded view of a process kit for according to one embodiment.

FIG. 9A is an exploded, isometric view of a process kit 900 according to one embodiment. The process kit 900 is shown inverted from the position when the process kit 900 is installed in a processing chamber. The process kit 900 is like the process kit 202 but uses a diffuser 902 and an exhaust manifold 904. The lid 906 has recesses 910, 912 in a surface into which the diffuser 902 and the exhaust manifold 904 are respectively disposed.

A mask frame 908 couples to the lid 906 with the diffuser 902 and the exhaust manifold 904 therebetween. The mask frame 908 has a gas inlet 942 and a gas outlet 944 defined by slots through the mask frame 908. A slot 946 in the diffuser 902 aligns with the gas inlet 942 in the mask frame 908 when the process kit 900 is assembled. Similarly, a slot 948 aligns with the gas outlet 944 in the mask frame 908 when the process kit 900 is assembled.

An inlet port 920 is disposed in the diffuser 902 at an end opposing the slot 946. A pumping port 922 is similarly disposed in the exhaust manifold 904 at an end opposing the slot 948. The inlet port 920 and the pumping port 922 will be discussed in detail in reference to FIGS. 10 and 11.

FIG. 9B is a plan view of the assembled process kit 900. The process kit 900 is shown with the diffuser 902 and the exhaust manifold 904 disposed in the recesses 910, 912 in the lid 906. The mask frame 908 is disposed over the lid 906. The gas outlet 944 is aligned with the slot 948 (not shown) in the exhaust manifold 904. The gas inlet 942 is aligned with the slot 946 (not shown) in the diffuser 902.

FIG. 10A is an isometric view of the diffuser 902. The diffuser 902 is formed from an upper member 1002 and a lower member 1004. A recess 1006 is formed in the lower member 1004. When the upper member 1002 and the lower member 1004 are coupled, the recess 1006 defines a flow path for a fluid, such as a processing gas, from the inlet port 920 to the slot 946.

The upper member 1002 is coupled to the lower member 1004 when disposed within the lid 906 of FIG. 9A-9B. In one embodiment, the upper member 1002 is coupled to the lower member 1004 by threaded fasteners. In other embodiments, the upper member 1002 and the lower member 1004 are coupled by bonding or latches (not shown). A seal 1008 is optionally disposed between the upper member 1002 and the lower member 1004 surrounding the recess 1006. In one embodiment, the seal 1008 is an O-ring disposed in a dove tail groove.

FIG. 10B is a cross section of the diffuser 902 along the section line indicated in FIG. 10A with the upper member 1002 coupled to the lower member 1004. At a center of the diffuser 902, a height 1040 is measured between the recess 1006 and a lower surface 1080 of the upper member 1002 at a radial distance 1070 from the inlet port 920 towards the slot 946. The lower surface 1080 tapers towards the outer surface 1060. At the periphery of the recess 1006, a height 1042 is measured between the lower surface 1080 of the upper member 1002 and the recess 1006 at a radial distance 1072 from the inlet port 920 towards the slot 946. The heights 1040, 1042 are the heights of the cross-section of the flow path defined by the recess 1006 and the upper member 1002. As shown in FIG. 10B, the height 1042 is larger than the height 1040. That is, the distance between the recess 1006 and the upper member 1002 at a central portion is less than the distance between the recess 1006 and the upper member 1002 at a peripheral region. The profile of the lower surface 1080 tapers nonlinearly (e.g. elliptically) as a function of the distance from the inlet port 920. As the distance from the inlet port 920 increases, such as radial distances 1070, 1072, the height between the recess 1006 and the lower surface 1080 also increases. In one embodiment, the height between the recess 1006 and the lower surface 1080 (e.g. height 1040, 1042) is proportionate to the square root of the radial distance from the inlet port 920. In another embodiment, the height between the recess 1006 and the lower surface 1080 (e.g. height 1040, 1042) is proportionate to the square root of the ratio of a radial distance from the inlet port 920 to a second radial distance from the inlet port 920. For example, the first radial distance may be the radial distance from the center of the inlet port 920 and the second radial distance may be radial distance from an edge of the inlet port 920. The elliptical profile of the recess 1006 equalizes flow conductance of a gas flowing from the inlet port 920 to the slot 946. Therefore, the gas flow is substantially uniform across the width of the slot 946 to a substrate (not shown).

FIG. 11A is an isometric view of the exhaust manifold 904. The exhaust manifold 904 is formed from an upper member 1102 and a lower member 1104. A port 1190 is optionally formed through the upper member 1102. The port 1190 allows for fluid communication between the upper member and a recess 1106 formed in the lower member 1104. When the upper member 1102 and the lower member 1104 are coupled, the recess 1106 defines a flow path for a fluid, such as a process gas, from the slot 948 to the pumping port 922. The port 1190 may be used, for example, to sample a gas flow within the recess 1106. The pumping port 922 is has a diameter substantially greater than a diameter of the inlet port 920 of FIG. 10A-10B to reduce non-uniformities in flow conductance of the gas caused by pumping thereof.

The upper member 1102 is coupled to the lower member 1104 when disposed within the lid 906 of FIG. 9A-9B. In one embodiment, the upper member 1102 is coupled to the lower member 1104 by threaded fasteners. In other embodiments, the upper member 1102 and the lower member 1104 are coupled by bonding or latches (not shown). A seal 1108 is optionally disposed between the upper member 1102 and the lower member 1104 surrounding the recess 1106. In one embodiment, the seal 1108 is an O-ring disposed in a dove tail groove.

FIG. 11B is a cross section of the exhaust manifold 904 along the section line indicated in FIG. 11A with the upper member 1102 coupled to the lower member 1104. At a center of the exhaust manifold 904, a height 1140 is measured between the recess 1106 and a lower surface 1180 of the upper member 1102 at a radial distance 1170 from the pumping port 922 towards the slot 948. The lower surface 1180 tapers towards the outer surface 1160. At the periphery of the recess 1106, a height 1142 is measured between the lower surface 1180 of the upper member 1102 and the recess 1106 at a radial distance 1172 from the pumping port 922 towards the slot 948. The heights 1140, 1142 are the heights of the cross-section of the flow path defined by the recess 1106 and the upper member 1102. As shown in FIG. 11B, the height 1142 is larger than the height 1140. That is, the distance between the recess 1106 and the upper member 1102 at a central portion is less than the distance between the recess 1106 and the upper member 1102 at a peripheral region. The profile of the lower surface 1180 tapers nonlinearly (e.g. elliptically) as a function of the distance from the pumping port 922. As the distance from the pumping port 922 increases, such as radial distances 1170, 1172, the height between the recess 1106 and the lower surface 1180 also increases. In one embodiment, the distance between the recess 1106 and the lower surface 1180 (e.g. heights 1140, 1142) is proportionate to the square root of the distance from the pumping port 922. In another embodiment, the height between the recess 1106 and the lower surface 1180 (e.g. heights 200 1140, 1142) is proportionate to the square root of the ratio of a radial distance from the pumping port 922 to a second radial distance from the pumping port 922. For example, the first radial distance may be the radial distance from the center of the pumping port 922 and the second radial distance may be radial distance from an edge of the pumping port 922. The elliptical profile of the recess 1106 equalizes flow conductance of a gas flowing from the slot 948 to the pumping port 922. Therefore, the gas flow is substantially uniform across the width of the slot 948.

While the foregoing is directed to embodiments of the present disclosure, other and further embodiments of the disclosure may be devised without departing from the basic scope thereof, and the scope thereof is determined by the claims that follow.

The invention claimed is:

1. A process kit for use in an atomic layer deposition (ALD) chamber, said process kit comprising:
    a dielectric window;
    a sealing frame;
    a mask frame connected with the sealing frame, wherein the mask frame has a gas inlet channel and a gas outlet channel formed therein on opposing sides thereof;
    a diffuser coupled to the gas inlet channel; and
    an exhaust manifold coupled to the gas outlet channel, wherein the diffuser and the exhaust manifold each comprise:
        a port; and
        a flow path coupled to the port partially defined by an elliptically tapered surface, wherein a cross-section of the flow path has a height at a center portion that is less than a height at a peripheral portion, and wherein the height at the center portion and the height at the peripheral portion are each proportionate to a square root of a ratio of a first radial distance from the port to a second radial distance from the port.

2. The process kit of claim 1, further comprising:
    a mask sheet coupled to the mask frame.

3. The process kit of claim 1, wherein a volume is formed between the dielectric window and the mask frame.

4. The process kit of claim 3, wherein the gas inlet channel and the gas outlet channel are in fluid communication with the volume.

5. The process kit of claim 1, wherein the process kit comprises a seal disposed between the dielectric window and the sealing frame.

6. The process kit of claim 1, wherein the process kit comprises a seal disposed between the dielectric window and the mask frame.

7. The process kit of claim 1, further comprising:
a compressible seal disposed in opposing sides of the mask frame, wherein the compressible seal is coupled to a keyway formed in the mask frame.

8. A process kit for use in an atomic layer deposition (ALD) chamber, said process kit comprising:
a dielectric window;
a sealing frame;
a mask frame connected with the sealing frame, wherein the mask frame has a gas inlet channel and a gas outlet channel formed therein on opposing sides thereof;
a mask sheet coupled to the mask frame;
a diffuser coupled to the gas inlet channel; and
an exhaust manifold coupled to the gas outlet channel, wherein the diffuser and the exhaust manifold each comprise:
a port; and
a flow path coupled to the port partially defined by an elliptically tapered surface, wherein a cross-section of the flow path has a height at a center portion that is less than a height at a peripheral portion, and wherein the height at the center portion and the height at the peripheral portion are each proportionate to a square root of a ratio of a first radial distance from the port to a second radial distance from the port.

9. The process kit of claim 8, wherein a volume is formed between the dielectric window and a substrate.

10. The process kit of claim 9, wherein the gas inlet channel and the gas outlet channel are in fluid communication with the volume.

11. The process kit of claim 8, wherein the process kit comprises a seal disposed between the dielectric window and the sealing frame.

12. The process kit of claim 8, wherein the process kit comprises a seal disposed between the dielectric window and the mask frame.

13. The process kit of claim 8, further comprising:
a compressible seal disposed in opposing sides of the mask frame, wherein the compressible seal is coupled to a keyway formed in the mask frame.

14. An apparatus for processing a substrate, comprising:
a chamber body;
a susceptor body;
at least one process gas inlet;
at least one pumping port; and
a process kit, wherein the process kit comprises:
a dielectric window;
a sealing frame;
a mask frame connected with the sealing frame, wherein the mask frame has a gas inlet channel and a gas outlet channel formed therein on opposing sides thereof;
a diffuser coupled to the gas inlet channel;
an exhaust manifold coupled to the gas outlet channel, wherein the diffuser and the exhaust manifold each comprise:
a port; and
a flow path coupled to the port partially defined by an elliptically tapered surface, wherein a cross-section of the flow path has a height at a center portion that is less than a height at a peripheral portion, and wherein the height at the center portion and the height at the peripheral portion are each proportionate to a square root of a ratio of a first radial distance from the port to a second radial distance from the port; and
a mask sheet in contact with a substrate positioned on the susceptor body.

15. The apparatus of claim 14, wherein the mask sheet is coupled to the mask frame.

16. The apparatus of claim 14, wherein a volume is formed between the dielectric window and the mask frame, and the gas inlet channel and the gas outlet channel are in fluid communication with the volume.

* * * * *